(12) United States Patent
Hekmat et al.

(10) Patent No.: US 9,680,430 B2
(45) Date of Patent: Jun. 13, 2017

(54) MISMATCHED DIFFERENTIAL CIRCUIT

(71) Applicant: SAMSUNG DISPLAY CO., LTD., Yongin, Gyeonggi-Do (KR)

(72) Inventors: Mohammad Hekmat, Mountain View, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 14 days.

(21) Appl. No.: 14/061,637

(22) Filed: Oct. 23, 2013

(65) Prior Publication Data

US 2014/0314171 A1    Oct. 23, 2014

Related U.S. Application Data

(60) Provisional application No. 61/814,756, filed on Apr. 22, 2013.

(51) Int. Cl.
*H03F 3/45* (2006.01)
*H03K 5/08* (2006.01)
*H04L 25/49* (2006.01)

(52) U.S. Cl.
CPC ..... *H03F 3/45179* (2013.01); *H03F 3/45183* (2013.01); *H03K 5/082* (2013.01); *H04L 25/4917* (2013.01)

(58) Field of Classification Search
CPC ........ H03F 1/3211; H03F 1/3205; H03F 3/16; H03F 1/223; H03F 1/301; H03F 2203/45028; H03F 2203/45212; H03F 3/393; H03F 3/45632; H03F 3/45677; H03F 3/45744; H03F 2003/45008;

(Continued)

(56) References Cited

U.S. PATENT DOCUMENTS 5,726,597 A  *  3/1998  Petty et al. ................... 327/307
6,222,395 B1    4/2001  Bertin et al.
6,623,732 B1    9/2003  Ma
(Continued)

FOREIGN PATENT DOCUMENTS

EP          1 104 092 A2    5/2001
WO      WO 99/07067 A1    2/1999

OTHER PUBLICATIONS

U.S. Office action dated Mar. 27, 2015, for cross reference U.S. Appl. No. 14/254,813, (10 pages).

(Continued)

*Primary Examiner* — Curtis Odom
(74) *Attorney, Agent, or Firm* — Lewis Roca Rothgerber Christie LLP

(57) ABSTRACT

A differential amplifier including: a first amplifier leg including a first transistor, and a second amplifier leg including a second transistor. Here, the first transistor is configured to have a bulk potential different from a bulk potential of the second transistor. The first amplifier leg and the second amplifier leg, together, may be configured to differentially amplify a received differential input signal. The differential amplifier may be configured to have an input offset voltage, which corresponds to the difference between the bulk potential of the first transistor and the bulk potential of the second transistor. The differential amplifier may be at an input stage of a comparator.

18 Claims, 8 Drawing Sheets

(58) Field of Classification Search
CPC .. H03F 2203/45032; H03F 3/185; H03F 3/45; H03F 3/45179
See application file for complete search history.

(56) References Cited

U.S. PATENT DOCUMENTS

| | | | |
|---|---|---|---|
| 6,927,714 | B1 | 8/2005 | Teterwak |
| 7,283,596 | B2 | 10/2007 | Brown |
| 8,222,954 | B1 | 7/2012 | Ren et al. |
| 2002/0000883 | A1 | 1/2002 | Cox |
| 2005/0151588 | A1 | 7/2005 | Bailey et al. |
| 2007/0057724 | A1 | 3/2007 | Koizumi et al. |
| 2008/0187037 | A1 | 8/2008 | Bulzacchelli et al. |
| 2009/0039958 | A1 | 2/2009 | Wu |
| 2009/0189694 | A1* | 7/2009 | Davierwalla et al. ........ 330/253 |
| 2009/0251217 | A1 | 10/2009 | Keerti |
| 2011/0115561 | A1 | 5/2011 | Kumar et al. |

OTHER PUBLICATIONS

Garlepp, et al.; A 1-10Gpbs PAM2, PAM4, PAM2 Partial Response Receiver Analog Front End with Dynamic Sampler Swapping Capability for Backplane Serial Communications; 2005 Symposium on VLSI Circuits Digest of Technical Papers; pp. 376-379.

Garg; A 1-Tap 40Gbps Look-Ahead Decision Feedback Equalizer in 0.18- μm SiGe BiCMOS Technology; Graduate Department of Electrical and Computer Engineering, University of Toronto; © 2005; 70 pps.

EPO Search Report dated Jan. 5, 2015, corresponding to European Patent application 14176819.2, (5 pages).

EPO Search Report dated Jul. 8, 2014, for corresponding European Patent application 14165501.9, (6 pages).

A. Martin et al., 8Gb/s Differential Simultaneous Bidirectional Link with 4mV 9ps Waveform Capture Diagnostic Capability, ISSCC 2003/Session 4/Clock Recovery and Backplane Transceivers/Paper 4.5, 2003 IEEE International Solid-State Circuits Conference, 10 pages, US.

EPO Search Report dated May 12, 2015, corresponding to European Patent application 14176819.2, (8 pages).

U.S. Office action dated Nov. 2, 2015, for cross reference U.S. Appl. No. 14/254,813, (10 pages).

* cited by examiner

MISMATCHED DIFFERENTIAL CIRCUIT

CROSS-REFERENCE TO RELATED APPLICATION

This utility patent application claims priority to and the benefit of U.S. Provisional Application No. 61/814,756, filed Apr. 22, 2013, entitled Triple-Mismatched Differential Pair, the entire content of which is incorporated herein by reference.

BACKGROUND

1. Field

Aspects of the present invention relate to a mismatched differential circuit and a comparator including a mismatched differential circuit.

2. Description of Related Art

A comparator is a device that compares two input signals and outputs a signal based on this comparison. In one configuration, a comparator receives two input signals and outputs a signal indicating which of the received signals is larger. In another configuration, a comparator receives two signals (e.g., two complementary signals) and outputs a signal indicating whether or not the difference between the two received signals is greater than a threshold level.

A comparator implemented to perform the above-described threshold detection has numerous applications, including multilevel serial/parallel links, analog-to-digital converters, and peak detection. Mismatched differential circuits may be used in a comparator to set the threshold levels. Enabling a wide range of threshold levels is desirable to extend the usable range of a comparator circuit (e.g., to increase the detection range).

SUMMARY

Aspects of the present invention are directed toward providing a mismatched differential circuit that enables a wide range of threshold levels. Mismatched differential circuits according to embodiments of the present invention may be used in comparators, as an example.

According to an embodiment of the present invention, the range of threshold levels of a comparator is extendable by controlling the bulk potential of devices in the differential circuit of a comparator. For example, in one embodiment, a triple-mismatched differential pair, which includes devices having mismatched bulk potentials, sizes, and currents, is provided to enable a wide-range of threshold levels for the comparator.

According to an embodiment of the present invention, a mismatched differential circuit having devices with mismatched bulk potentials is provided as part of a digital communication link for a display.

According to an embodiment of the present invention, there is provided a differential amplifier, which includes: a first amplifier leg including a first transistor; and a second amplifier leg including a second transistor. Here, the first transistor is configured to have a bulk potential different from a bulk potential of the second transistor.

The differential amplifier may be configured to be at an input stage of a comparator, the first amplifier leg and the second amplifier leg, together, may be configured to differentially amplify a received differential input signal, the differential amplifier may be configured to have an input offset voltage, and the input offset voltage may correspond to the difference between the bulk potential of the first transistor and the bulk potential of the second transistor.

The first transistor may have a first device size and the second transistor may have a second device size different from the first device size, and the input offset voltage may further correspond to the difference between the first device size and the second device size.

The first device size may correspond to a channel width or length of the first transistor and the second device size may correspond to a channel width or length of the second transistor.

The differential amplifier may further include a first current sink configured to sink a first current; a second current sink configured to sink a second current; a third transistor; and a fourth transistor. Here, each of the first transistor, the second transistor, the third transistor, and the fourth transistor may include a first terminal, a second terminal, and a gate, the first terminal of the first transistor may be coupled to the first terminal of the fourth transistor, the first terminal of the second transistor may be coupled to the first terminal of the third transistor, the gate of the first transistor may be coupled to the gate of the fourth transistor, the gate of the second transistor may be coupled to the gate of the third transistor, the second terminal of the first transistor and the second terminal of the second transistor may be coupled together and coupled to the first current sink, the second terminal of the third transistor and the second terminal of the fourth transistor may be coupled together and coupled to the second current sink, and the input offset voltage may further correspond to the difference between the first current and the second current.

The offset voltage may be dynamically configurable by adjusting at least one of the first current, the second current, the bulk potential of the first transistor, the bulk potential of the second transistor, an effective width or length of the first transistor, or an effective width or length of the second transistor. The width or length of a transistor may be dynamically changed by controlling a series of switches that may be variously connected to adjust the width or length of the transistor.

Each of the first transistor and the third transistor may have a first device size, each of the second transistor and the fourth transistor may have a second device size different from the first device size, and the input offset voltage may further correspond to the difference between the first device size and the second device size.

Each of the first transistor and the second transistor may be a field effect transistor and may include a bulk, a gate, a drain, and a source. Here, the bulk of the first transistor may be coupled to one of the source of the first transistor, a ground, or a bias voltage source, the bulk of the second transistor may be coupled to one of the source of the second transistor, the ground, or the bias voltage source, and the bulk of the first transistor may be coupled differently than the bulk of the second transistor to cause the bulk potential of the first transistor to be different from the bulk potential of the second transistor.

Each of the first transistor and the second transistor may be a P-MOS field effect transistor, the bulk of the first transistor may be coupled to the source of the first transistor, and the bulk of the second transistor maybe coupled to the bias voltage source.

Each of the first transistor and the second transistor may be an N-MOS field effect transistor, the bulk of the first transistor may be coupled to the source of the first transistor, and the bulk of the second transistor maybe coupled to the ground.

The bulk of the first transistor may be coupled to the bias voltage source, the bulk of the second transistor may be coupled to the ground, and the bias voltage source may be controllable to dynamically change the difference between the bulk potential of the first transistor and the bulk potential of the second transistor.

According to another embodiment of the present invention, there is provided, a multilevel signal receiver, which includes: an input terminal for receiving a multilevel differential signal; a data slicer coupled to the input terminal and configured to determine voltage levels of the multilevel differential signal, the data slicer including a plurality of comparators; and a decoder coupled to an output of the data slicer and configured to decode bits of the multilevel differential signal. Here, each of the comparators includes a differential amplifier, the differential amplifier including: a first amplifier leg including a first transistor, and a second amplifier leg including a second transistor, the second transistor being configured to have a bulk potential different from a bulk potential of the first transistor, the first amplifier leg and the second amplifier leg, together, are configured to differentially amplify the multilevel differential signal to generate a threshold determination signal, the differential amplifier is configured to have an input offset voltage, the input offset voltage corresponds to the difference between the bulk potential of the first transistor and the bulk potential of the second transistor, each of the comparators is configured to have a threshold level different from the threshold level of other ones of the comparators, each of the comparators is configured to output its threshold determination signal to the decoder to indicate whether or not the multilevel signal is greater than its threshold level, and for each of the comparators, the threshold level corresponds to the input offset voltage of the differential amplifier.

The plurality of comparators may include a first comparator having its threshold level set to a first level, a second comparator having its threshold level set to a second level, and a third comparator having its threshold level set to a third level. Here, the multilevel signal may be configured to encode two bits using four signal levels, and the first level, the second level, and the third level may respectively be set to detect the four signal levels.

In the differential amplifier of at least one of the comparators: the first transistor may have a first device size and the second transistor may have a second device size different from the first device size, and the input offset voltage may further correspond to the difference between the first device size and the second device size.

The differential amplifier of each of the comparators may further include: a first current sink configured to sink a first current; a second current sink configured to sink a second current; a third transistor; and a fourth transistor. Here, in the differential amplifier of at least one of the comparators: each of the first transistor, the second transistor, the third transistor, and the fourth transistor may include a first terminal, a second terminal, and a gate, the first terminal of the first transistor may be coupled to the first terminal of the fourth transistor, the first terminal of the second transistor may be coupled to the first terminal of the third transistor, the gate of the first transistor may be coupled to the gate of the fourth transistor, the gate of the second transistor may be coupled to the gate of the third transistor, the second terminal of the first transistor and the second terminal of the second transistor may be coupled together and coupled to the first current sink, the second terminal of the third transistor and the second terminal of the fourth transistor may be coupled together and coupled to the second current sink, and the input offset voltage may further correspond to the difference between the first current and the second current.

In the differential amplifier of at least one of the comparators the offset voltage may be dynamically configurable by adjusting at least one of the first current, the second current, the bulk potential of the first transistor, the bulk potential of the second transistor, an effective width or length of the first transistor, or an effective width or length of the second transistor.

In the differential amplifier of at least one of the comparators: each of the first transistor and the third transistor may have a first device size, each of the second transistor and the fourth transistor may have a second device size different from the first device size, and the input offset voltage may further correspond to the difference between the first device size and the second device size.

In the differential amplifier of at least one of the comparators: each of the first transistor and the second transistor may be a field effect transistor and may include a bulk, a gate, a drain, and a source, the bulk of the first transistor may be coupled to one of the source of the first transistor, a ground, or a bias voltage source, the bulk of the second transistor may be coupled to one of the source of the second transistor, the ground, or the bias voltage source, and the bulk of the first transistor may be coupled differently than the bulk of the second transistor to cause the bulk potential of the first transistor to be different than the bulk potential of the second transistor.

In the differential amplifier of at least one of the comparators: each of the first transistor and the second transistor may be a P-MOS field effect transistor, the bulk of the first transistor may be coupled to the source of the first transistor, and the bulk of the second transistor may be coupled to the bias potential source.

In the differential amplifier of at least one of the comparators: each of the first transistor and the second transistor may be a N-MOS field effect transistor, the bulk of the first transistor may be coupled to the source of the first transistor, and the bulk of the second transistor may be coupled to the ground.

BRIEF DESCRIPTION OF THE DRAWINGS

The accompanying drawings illustrate exemplary embodiments of the present invention, and, together with this specification, serve to explain features and aspects of the present invention.

DETAILED DESCRIPTION

Figure 1:
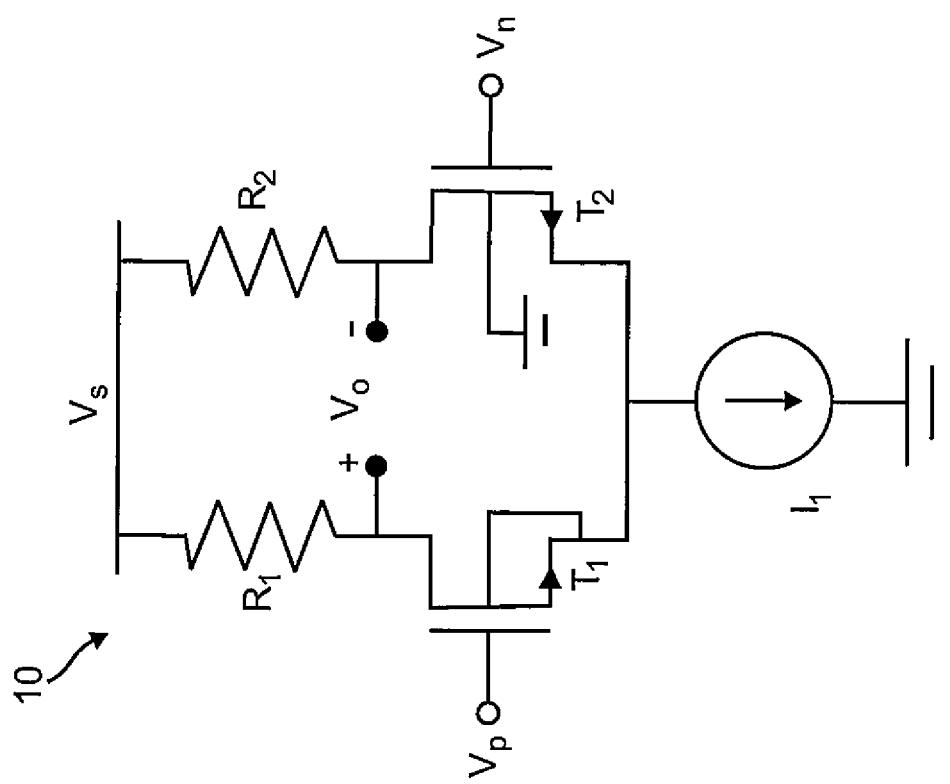
FIG. 1 illustrates a mismatched differential circuit according to an embodiment of the present invention.

Aspects of the present invention relate to a mismatched differential circuit that enables a wide range of threshold levels.

Mismatched differential circuits according to embodiments of the present invention may be included in comparators. For example, a mismatched differential circuit may be used to adjust a comparator's threshold level. A mismatched differential circuit may be implemented as a differential amplifier pair (commonly referred to as a "differential pair"), where the two amplifying stages (or legs) with common (emitter, source, cathode, etc.) degeneration have different (or mismatched) properties. This property mismatch creates an inherent offset in the amplifying stages. Accordingly, by changing the property mismatch, the offset changes; thus, the comparator's threshold level may be adjusted.

According to one or more embodiments of the present invention, the range of threshold levels of a comparator is extendable by controlling the bulk potential of devices in a differential circuit of a comparator. Controlling the bulk potential of devices in the differential circuit provides a cost effective and powerful way of creating a property mismatch in the differential circuit.

According to embodiments of the present invention, a device's bulk potential may be controlled in a static or dynamic fashion to control an offset voltage, and thus, extend the achievable range of a comparator's threshold level. According to other embodiments of the present invention, the method of adjusting the threshold voltage by controlling devices' bulk-potentials is combined with other methods, such as device size or bias current mismatch, to further extend the achievable range of a comparator's threshold level.

Hereinafter, certain embodiments of the present invention are shown and described by way of illustration. As those skilled in the art would recognize, the invention may be embodied in many different forms and should not be construed as being limited to the embodiments set forth herein. Instead, the detailed description should be construed to encompass the scope of the appended claims and equivalents thereof. Also, in the present application, when an element is referred to as being "coupled" (e.g., electrically coupled or connected) to another element, it may be directly coupled to the other element or indirectly coupled to the other element with one or more intervening elements interposed therebetween. Hereinafter, like reference numerals refer to like elements.

FIG. 1 illustrates a mismatched differential circuit according to an embodiment of the present invention.

The mismatched differential circuit 10 of the present embodiment includes a first transistor $T_1$ and a second transistor $T_2$, which have their sources commonly coupled to a current sink $I_1$ and their drains coupled to a voltage source $V_s$ through respective resistors $R_1$ and $R_2$.

Collectively, the first and second transistors $T_1$ and $T_2$, the first and second resistors $R_1$ and $R_2$, the voltage source $V_s$, and the current sink $I_1$ form at least a part of a differential pair amplifier (commonly referred to as a "differential pair"), which has a first amplifying stage and a second amplifying stage that are complementary to each other. Here, the side of the differential pair including the first transistor $T_1$ corresponds to the first amplifying stage and the side of the differential pair including the second transistor $T_2$ corresponds to the second amplifying stage.

According to embodiments of the present invention, the first and second amplifying stages of the differential pair are mismatched. That is, the first amplifying stage has different properties than the second amplifying stage. By mismatching the first and second amplifying stages, an input offset (or offset voltage) for the differential pair is created, which in turn, may be used to set a threshold level of a comparator.

In other words, the comparator's threshold level may be a function of the particular mismatch in properties of the differential pair at an input stage of a comparator.

Such mismatches may arise, for example, from differences is sizing or threshold voltages of the components of the differential pair. For example, in the present embodiment, the mismatches may arise from differences in device sizing or threshold voltages of the first and second transistors $T_1$ and $T_2$.

In some embodiments of a differential pair, the input offset may be determined according to the following equation: $V^2_{os} = (I_D/g_m)^2 (\Delta(W/L)/(W/L))^2 + \Delta V^2_{th}$. Here, $V_{os}$ is the voltage for which the output voltage of the differential pair is zero (i.e., the offset voltage), $I_D$ is the drain current of the transistors, $g_m$ is the transconductance of the transistors, W is the width of the transistors, and L is the length of the transistors.

In many applications, controlling the input offset via transistor threshold voltage $V_{th}$ is particularly attractive as it directly appears at the input as an offset and may be implemented efficiently with minimal additional circuit complexity. According to embodiments of the present invention, controlling the bulk potential of the transistors of the differential pair in a static or dynamic fashion sets (or partially sets) the offset voltage of the differential pair, and thus, extends the achievable range of the threshold level of a comparator.

The bulk potential of a transistor may be controlled in a static fashion by, for example, hardwiring the bulk of the transistor to a particular node of the transistor (e.g., source), to ground, or to a static voltage source (e.g., a bias voltage).

The first and second transistors $T_1$ and $T_2$ of the differential circuit 10 of FIG. 1 illustrate example embodiments of static controlled bulk potentials. The first transistor $T_1$ of the present embodiments illustrates a bulk-to-source implementation, and the second transistor $T_2$ illustrates a bulk-to-ground implementation. By connecting the bulks of the first transistor $T_1$ and the second transistor $T_2$ differently, the bulk potentials of the respective transistors are different from each other, which in turn, causes a threshold voltage $V_{th}$ difference in the differential circuit (i.e., a property mismatch). As described above, this property mismatch sets the offset voltage $V_{os}$ of the differential pair, and thus, controls the threshold level of the comparator.

The bulk potential may be controlled dynamically by, for example, coupling at least one of the transistor's bulk to an adjustable voltage source. By adjusting a transistor's bulk potential with an adjustable voltage source, the difference between the threshold voltages $V_{th}$ of the transistors may be controlled; thus, the offset voltage $V_{os}$ of the differential pair may be dynamically adjusted.

The difference between, the threshold voltages $V_{th}$ may be dynamically controlled by adjusting the effective size (e.g., the effective length or width) of a transistor. For example, the width or length of a transistor may be dynamically changed by electronically controlling a series of switches that may be variously connected to adjust the effective width or length of the transistor.

Figure 2:
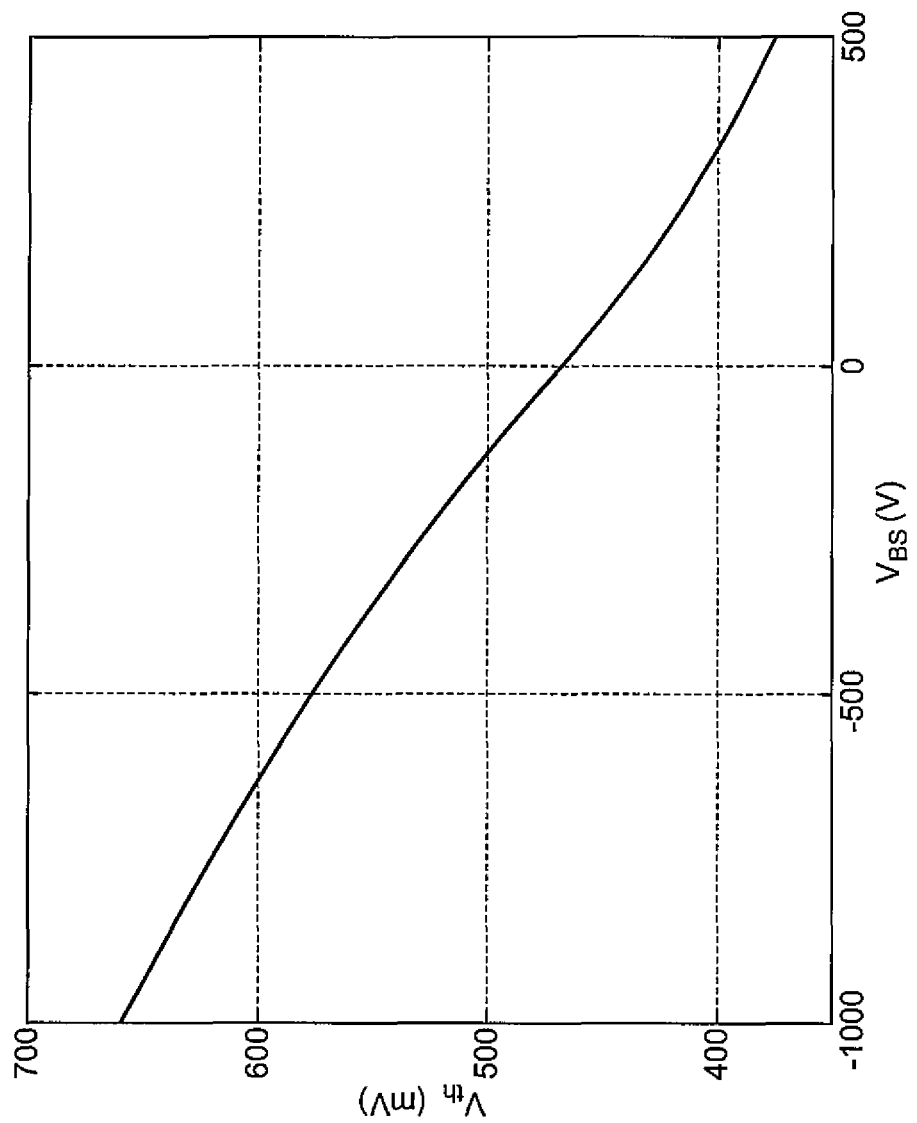
FIG. 2 is a graph illustrating a relationship between a transistor's bulk-to-source voltage versus its threshold voltage according to an embodiment of the present invention.

FIG. 2 is a graph illustrating a relationship between a transistor's bulk-to-source voltage versus its threshold voltage according to an embodiment of the present invention.

As shown in FIG. 2, by controlling the bulk-to-source voltage $V_{BS}$ of a transistor (e.g., dynamically or statically as described above), the transistor's threshold voltage $V_{th}$ may be set. For example, when the bulk-to-source voltage $V_{BS}$ is set to about 0V, the threshold voltage $V_{th}$ may be about 470 mV, or when the bulk-to-source voltage $V_{BS}$ is set to about −500 mV, the threshold voltage $V_{th}$ may be about 575 mV.

Referring back to FIG. 1, the differential circuit further includes two input nodes to receive a complementary pair of input signals $V_p$ and $V_n$, respectively, and two output nodes to output the complementary pair of output signals $V_{o+}$ and $V_{o-}$, respectively. In the present embodiment, the two input nodes are at the gates of the first and second transistors $T_1$ and $T_2$, and the output nodes are at the drains of the first and second transistors $T_1$ and $T_2$.

The complementary pair of input signals $V_p$ and $V_n$ (together, the differential input signal) are differentially amplified (i.e., subtracted and multiplied) by the differential pair to generate the complementary pair of output signals $V_{o+}$ and $V_{o-}$ (together, the differential output signal).

Figure 3:
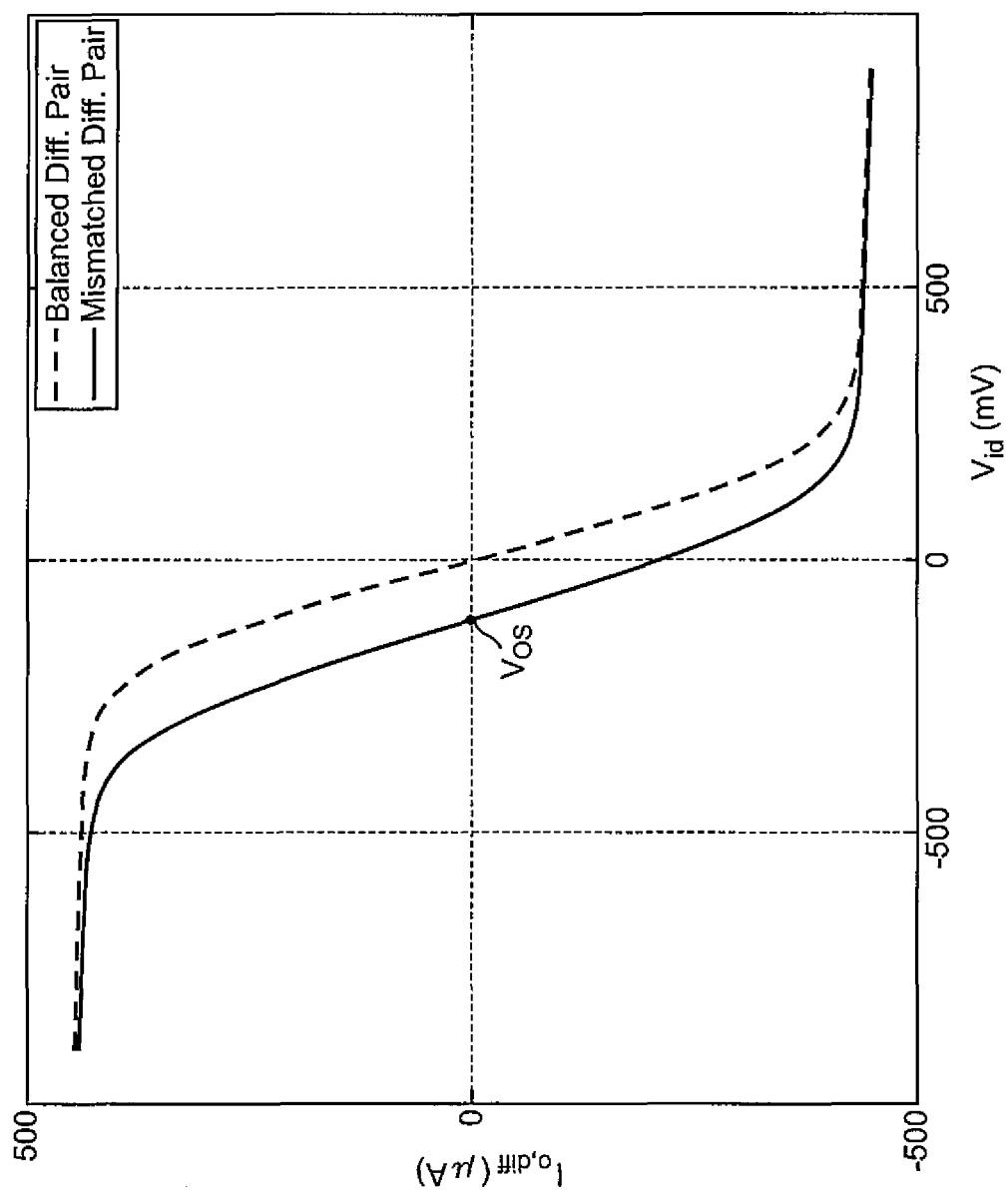
FIG. 3 is a graph illustrating the I-V characteristics of differential circuits according to embodiments of the present invention.

FIG. 3 is a graph illustrating the I-V characteristics of differential circuits according to embodiments of the present invention. FIG. 3 illustrates two example I-V characteristics, one for a balanced differential circuit (indicated by the dashed line) and another for a mismatched differential circuit (indicated by the solid line). In FIG. 3, the x-axis represents a differential input voltage and the y-axis represents a differential output current for differential circuits.

In a balanced differential circuit (e.g., a differential amplifier pair with matching amplifier stages), when the differential input signal is 0V, the differential output signal is 0V. This is illustrated in FIG. 3 by the zero-crossing of the balanced differential circuit I-V characteristic being at 0V. Also, in the present example, when the differential input signal is positive, a negative differential output signal is generated, and when the differential input signal is negative, a positive differential output signal is generated.

The balanced differential circuit may be used in a comparator circuit having a 0V threshold level. That is, it may be used to detect whether a received differential input signal is less than or greater than 0V.

In a mismatched differential circuit (e.g., a differential amplifier with mismatched amplifier stages), when the differential input signal is at an offset voltage $V_{os}$, the differential output signal is 0V. This is illustrated in FIG. 3 by the zero-crossing of the mismatched differential circuit I-V characteristic being at the offset voltage $V_{os}$. Also, in the present embodiment, when the differential input signal is greater than the offset voltage $V_{os}$, a negative differential output signal is generated, and when the differential input signal is less than the offset voltage $V_{os}$, a positive differential output signal is generated.

The mismatched differential circuit may be used, in a comparator circuit having a threshold level at (or based on) the offset voltage $V_{os}$. That is, it may be used to detect whether a received differential input signal is less than or greater than the offset voltage $V_{os}$.

As described above, the offset voltage $V_{os}$ may be set by adjusting the bulk potential of transistors in the differential circuit. However, embodiments of the present invention are not limited thereto; for example, other methods of adjusting the offset voltage of a differential circuit may be used in conjunction with adjusting the bulk potential.

According to one embodiment of the present invention, the range of achievable comparator threshold levels may be extended by adjusting the size as well as the bulk potential of a device in a differential circuit. According to an aspect of the present invention, the device size includes the width and/or length of a channel of a transistor.

According to one embodiment, transistors in a differential pair may have mismatched bulk potentials (e.g., one transistor having a bulk-to-source connection and another having a bulk-to-ground connection) and widths (e.g., one transistor having a 15 μm width and another having a 5 μm width).

Figure 4:
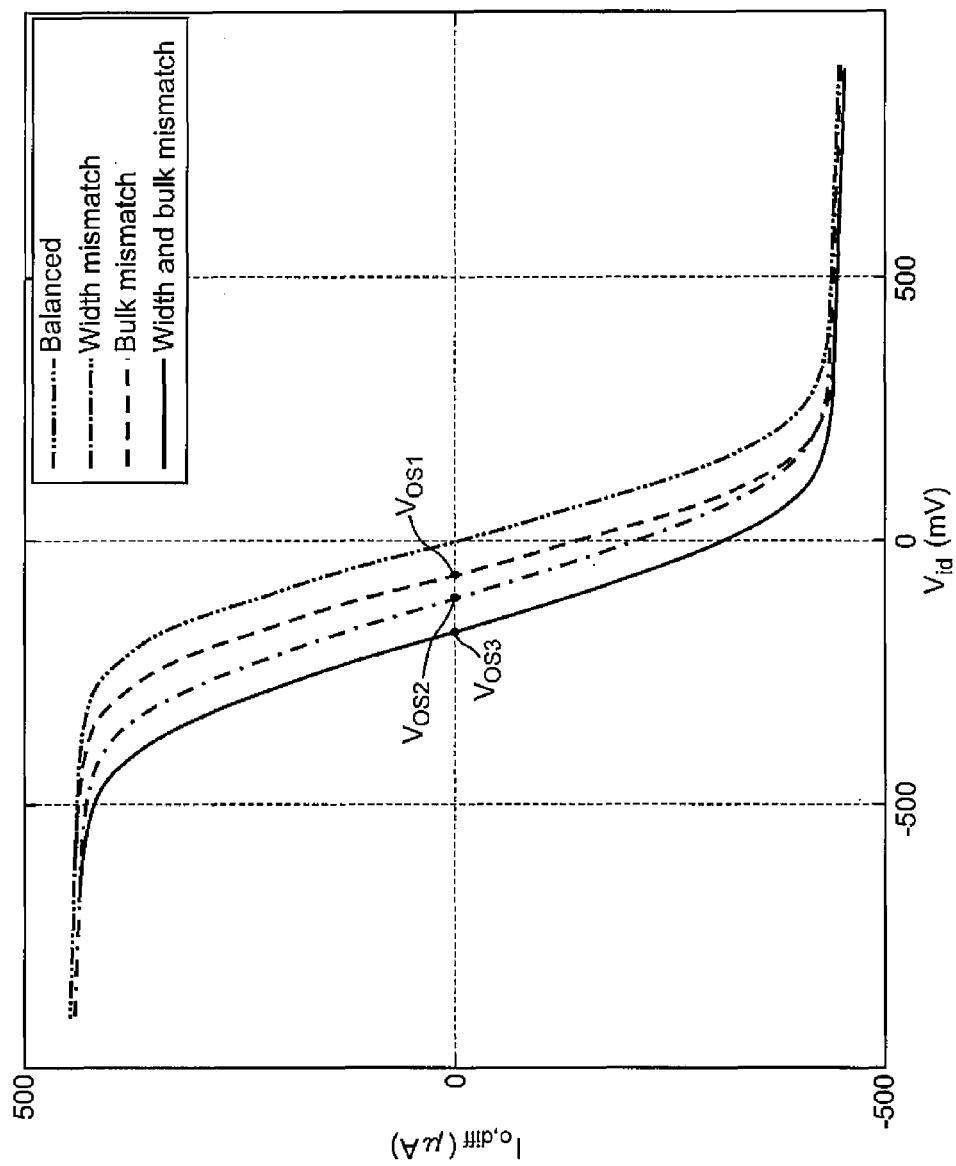
FIG. 4 is a graph illustrating the I-V characteristics of differential circuits according to other embodiments of the present invention.

FIG. 4 is a graph illustrating the I-V characteristics of differential circuits according to other embodiments of the present invention. FIG. 4 illustrates four example I-V characteristics, one for a balanced differential circuit (indicated by a line having a dash, two dots, and a dash, repeating, i.e., -••-), a second for a bulk mismatched differential circuit (indicated by a line having a dash, one dot, and a dash, repeating, i.e., -•-), a third for a width mismatched differential circuit (indicated by a dashed line, i.e., - - -), and a fourth for a width and bulk mismatched differential circuit (indicated by a solid line). In FIG. 4, the x-axis represents a differential input voltage and the y-axis represents a differential output current for differential circuits.

In a balanced differential circuit (e.g., a differential amplifier with matching amplifier stages), when the differential input signal is 0V, the differential output signal is 0V. This is illustrated in FIG. 4 by the zero-crossing of the balanced differential circuit I-V characteristic being at 0V. Also, in the present embodiment, when the differential input signal is positive, a negative differential output signal is generated, and when the differential input signal is negative, a positive differential output signal is generated.

The balanced differential circuit may be used in a comparator circuit having a 0V threshold level. That is, it may be used to detect whether a received differential input signal is less than or greater than 0V.

In a bulk mismatched differential circuit (e.g., a differential amplifier with amplifier stages having mismatched bulk potentials), when the differential input signal is at a first offset voltage $V_{os1}$, the differential output signal is 0V. This is illustrated in FIG. 4 by the zero-crossing of the bulk mismatched differential circuit I-V characteristic being at the first offset voltage $V_{os1}$. Also, in the present embodiment, when the differential input signal is greater than the first offset voltage $V_{os1}$, a negative differential output signal is generated, and when the differential input signal is less than the first offset voltage $V_{os1}$, a positive differential output signal is generated.

The bulk mismatched differential circuit may be used in a comparator circuit having a threshold level at the first offset voltage $V_{os1}$. That is, it may be used to detect whether a received differential input signal is less than or greater than the first offset voltage $V_{os1}$.

In a width mismatched differential circuit (e.g., a differential amplifier with amplifier stages having mismatched device widths), when the differential input signal is at a second offset voltage $V_{os2}$, the differential output signal is 0V. This is illustrated in FIG. 4 by the zero-crossing of the width mismatched differential circuit I-V characteristic being at the second offset voltage $V_{os2}$. Also, in the present embodiment, when the differential input signal is greater than the second offset voltage $V_{os2}$, a negative differential output signal is generated, and when the differential input signal is less than the second offset voltage $V_{os2}$, a positive differential output signal is generated.

The width mismatched differential circuit may be used in a comparator circuit having a threshold level at the second offset voltage $V_{os2}$. That is, it may be used to detect whether a received differential input signal is less than or greater than the second offset voltage $V_{os2}$.

In a width and bulk mismatched differential circuit (e.g., a differential amplifier with amplifier stages having mismatched device widths and bulk potentials), when the differential input signal is at a third offset voltage $V_{os3}$, the differential output signal is 0V. This is illustrated in FIG. 4 by the zero-crossing of the width and bulk mismatched differential circuit I-V characteristic being at the third offset voltage $V_{os3}$. Also, in the present embodiment, when the differential input signal is greater than the third offset voltage $V_{os3}$, a negative differential output signal is generated, and when the differential input signal is less than the third offset voltage $V_{os3}$, a positive differential output signal is generated.

The bulk and width mismatched differential circuit may be used in a comparator circuit having a threshold level at the third offset voltage $V_{os3}$. That is, it may be used to detect whether a received differential input signal is less than or greater than the third offset voltage $V_{os3}$.

As is illustrated in FIG. 4, by combining offset voltage shifting methods, a greater range of achievable offset voltages (and thus, a greater range of comparator threshold levels) is enabled as compared to using only one method.

Additionally, offset voltage shifting methods are not limited to adjusting device characteristics. For example, offset voltages may be adjusted by controlling current mismatches in a differential circuit.

Figure 5:
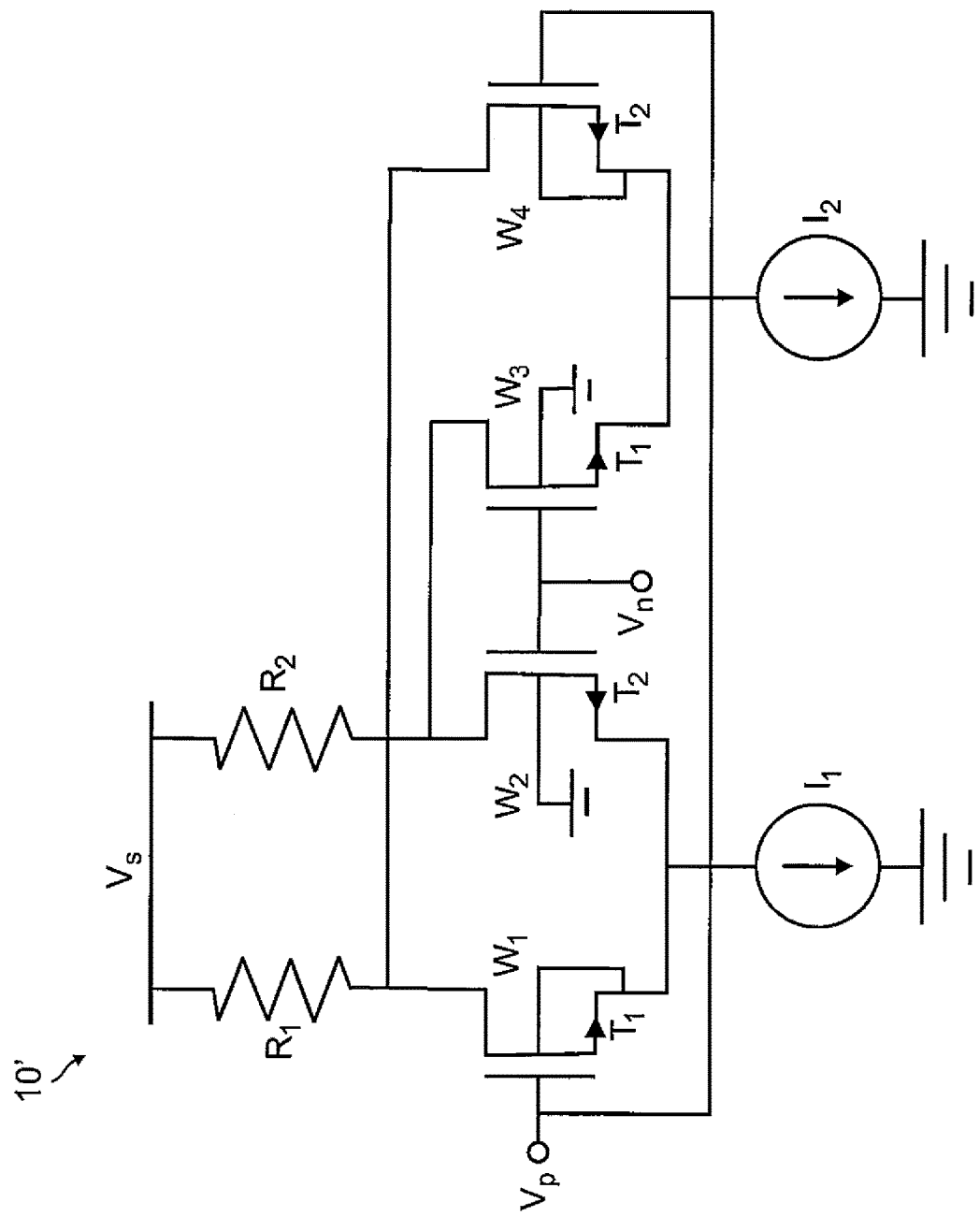
FIG. 5 illustrates a mismatched differential circuit according to another embodiment of the present invention.

FIG. 5 illustrates a mismatched differential circuit for a comparator according to another embodiment of the present invention. The mismatched differential circuit 10' of FIG. 5 illustrates an embodiment of the present invention that provides a triple-mismatched differential pair. That is, the mismatched differential circuit 10' illustrates a differential amplifier circuit that may have property mismatches in device bulk potential, device width, and bias current.

The mismatched differential circuit 10' according to the present embodiment includes two differential amplifier pairs, each configured substantially similar to the differential amplifier pair described in connection with FIG. 3.

Specifically, the mismatched differential circuit 10' of FIG. 5 includes first through fourth transistors $T_1$ through $T_4$, where each transistor corresponds to one amplifier stage of one of the two amplifier pairs. Here, the first transistor $T_1$ and the second transistor $T_2$ have their sources commonly coupled to a first current sink $I_1$ and are coupled to a voltage source $V_s$ through respective resistors $R_1$ and $R_2$. The first and second transistors $T_1$ and $T_2$ correspond to the first differential amplifier pair. The third transistor $T_3$ and the fourth transistor $T_4$ similarly have their sources commonly coupled to a second current sink $I_2$ and are coupled to the voltage source $V_s$ through respective resistors $R_1$ and $R_2$. The third and fourth transistors $T_3$ and $T_4$ correspond to the second differential amplifier pair.

The first and second differential amplifier pairs are coupled together to effectively operate as a single differential amplifier pair. That is, the first and second differential pairs collective receive the same differential input signal and, operate together to produce a single differential output signal.

A feature of using the two coupled differential amplifier pairs is that the different current sinks may be mismatched so as to provide additional offset voltage range. For example, the value of the current of the first current sink $I_1$ may be set to be larger than the value of the current of the second current sink $I_2$, which creates an asymmetric amplifying leg resulting in the sought after control of the offset voltage.

Another feature of using the two coupled differential amplifier pairs is that there are more device parameters available to adjust, which adds further offset voltage flexibility. For example, the bulk potentials and/or widths $W_1$ through $W_4$ of the transistors may be adjusted so as to enable further flexibility in the available offset voltage.

The mismatched differential circuits according to embodiments of the present invention may be formed of complementary metal oxide semiconductor (CMOS) devices. For example, as illustrated in FIGS. 1 and 5, the mismatched differential circuits may be formed of N-MOS field effect transistors (FETs). As one of ordinary skill in the art would appreciate, however, the scope of the present invention applies to devices other than those explicitly described and illustrated in the present application. For example, differential circuits according to the present invention may be implemented using P-MOS FETs. According to one embodiment, when the differential circuits are implemented using P-MOS FETs, the bulks of the P-MOS FETs may be coupled to a bias voltage source where, if using N-MOS FETs, the bulks would have been coupled to a ground.

Hereinafter, an application of a comparator having a mismatched differential circuit according to an embodiment of the present invention is described. Specifically, the following description is of using comparators having mismatched differential circuits in a multilevel data system.

Multilevel data systems quantize data into more than two levels, thereby using less channel bandwidth than the same capacity binary data system. One such multilevel data system is a PAM-4 (pulse amplitude modulation-4) data system. A PAM-4 data system may include a transmitter, a transmission link, and a receiver. The PAM-4 transmitter encodes a pair of bits into a four-level signal, for example, $V_1$, $V_2$, $V_3$, and $V_4$ (e.g., −0.66V, −0.33V, 0.33V, and 0.66V) and sends the encoded multilevel signal over the transmission link to the PAM-4 receiver. The PAM-4 receiver reconstructs the transmitted multilevel signal by comparing the received signal to three different threshold voltages, $V_{R1}$, $V_{R2}$, and $V_{R3}$.

In one embodiment of a PAM-4 receiver, the threshold voltages are determined according to the following logic: $V_1 < V_{R1} < V_2 < V_{R2} < V_3 < V_{R3} < V_4$. For example, where the four levels of the multilevel signal are −0.66V, −0.33V, 0.33V, and 0.66V, the threshold voltages may be −0.5V, 0V, and 0.5V (e.g., a differential configuration). In another example, where the four levels of the multilevel signal are 0V, 0.33V, 0.66V, and 1V, the threshold voltages may be 0.25V, 0.5V, and 0.75V (e.g., a single ended configuration).

Here, if the received multilevel signal is less than $V_{R1}$, then the receiver determines that the multilevel signal is transmitting the logic level associated with $V_1$ (e.g., 00). If the received multilevel signal is greater than $V_{R1}$, but less than $V_{R2}$, then the receiver determines that the multilevel signal is transmitting the logic level associated with $V_2$ (e.g., 01). If the received multilevel signal is greater than $V_{R2}$, but less than $V_{R3}$, then the receiver determines that the multilevel signal is transmitting the logic level associated with $V_3$ (e.g., 10). And, if the received multilevel signal is greater than $V_{R2}$, then the receiver determines that the multilevel signal is transmitting the logic level associated with $V_4$ (e.g., 11).

In an implementation of a PAM-4 receiver, the multilevel signal is reconstructed by using three comparators, each having a different threshold level, and a decoder.

Figure 6:
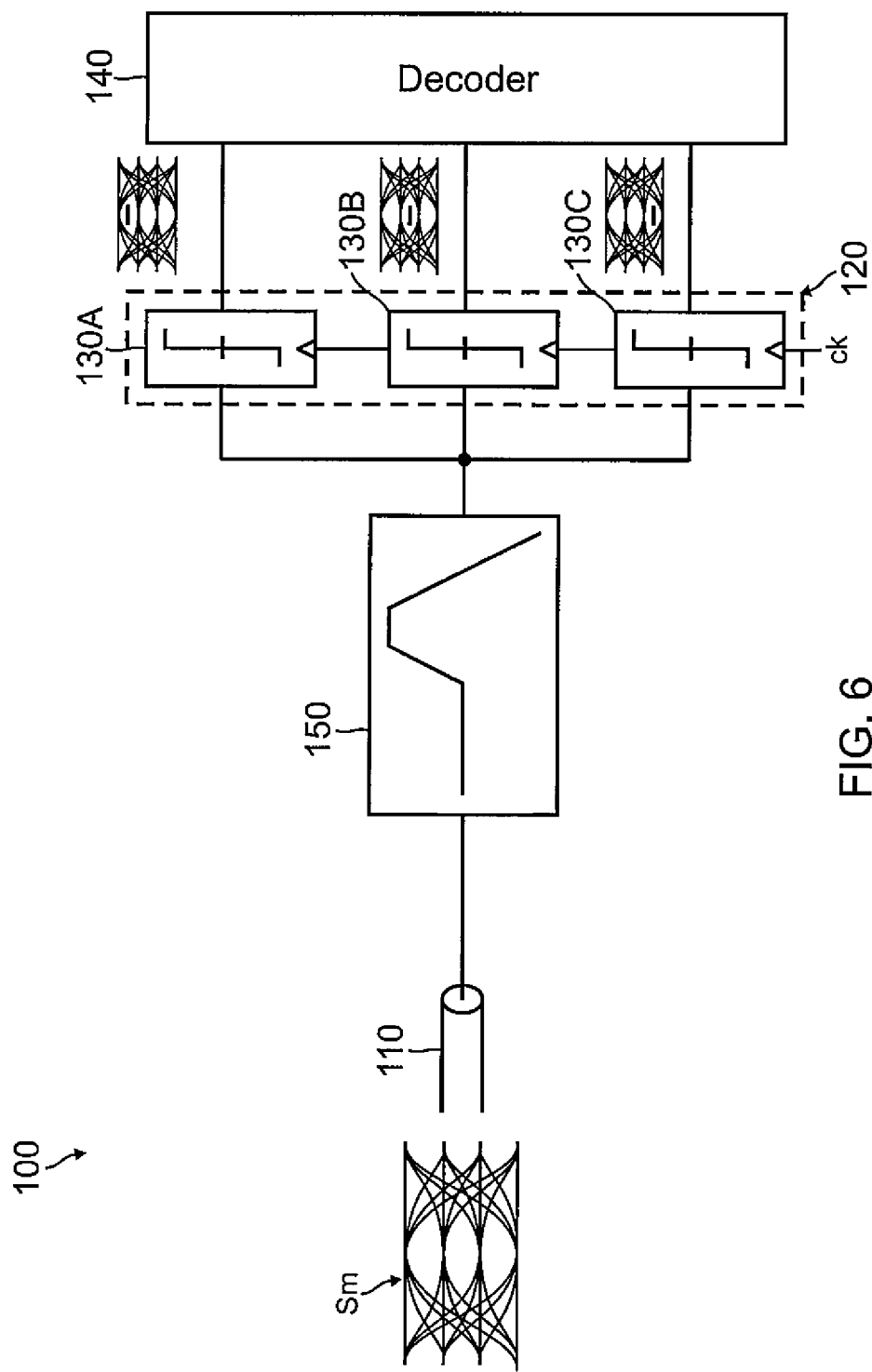
FIG. 6 illustrates a receiver for a pulse amplitude modulation data system.

FIG. 6 illustrates a PAM-4 receiver according to an embodiment of the present invention.

According to an embodiment of the present invention, a pulse amplitude modulation (PAM) receiver 100 includes a transmission link 110 for receiving the multilevel data signal $S_m$ (which encodes more than one bit of data), a data slicer 120 that includes a plurality of comparators 130, and a decoder 140. The PAM receiver may also include a pre-amplifier 150 to provide gain and equalization to the multilevel data signal $S_m$ before it reaches the data slicer 120. According to an embodiment of the present invention, the multilevel data signal $S_m$ is a differential signal.

In accordance with one aspect of the present invention, a data slicer 120 includes a first comparator 130A that establishes a first threshold voltage $V_{R1}$, a second comparator 130B that establishes a second threshold voltage $V_{R2}$, and a third comparator 130C that establishes a third threshold voltage $V_{R3}$. As described above, the second threshold voltage $V_{R2}$ may be greater than the first threshold voltage $V_{R1}$ and less than the third threshold voltage $V_{R3}$.

The comparators 130A, 130B, and 130C establish these three threshold levels to provide four distinct outputs depending on the relationship of the multilevel data signal $S_m$ to the three thresholds. Accordingly, the inputs of the comparators 130A, 130B, and 130C are coupled together to form a common differential input terminal to receive the multilevel data signal $S_m$.

Also, each of the comparators 130A, 130B, and 130C has a differential output terminal coupled to the decoder 140. The decoder 140 receives each of the comparators' 130A, 130B, and 130C differential output signal (e.g., a threshold determination signal) from their respective differential output terminal, and decodes the data transmitted via the multilevel data signal $S_m$ based on the received differential output signals.

As mentioned above, the comparators 130A, 130B, and 130C collectively provide four distinct outputs to the decoder. Each of these outputs corresponds to a particular one of the four signal levels of generated by a PAM-4 transmitter, which encodes two bits of data. Accordingly, the decoder can decode the two bits of data transmitted by the PAM-4 multilevel data signal $S_m$.

According to an aspect of the present invention, the threshold levels of the comparators 130A, 130B, and 130C are controlled using mismatched differential circuits.

For example, the first comparator 130A may include a first mismatched differential circuit that has a first offset voltage $V_{os1}$ to enable the first threshold level voltage $V_{R1}$, the second comparator 130B may include a second mismatched differential circuit that has a second offset voltage $V_{os2}$ to enable the second threshold level voltage $V_{R2}$, and the third comparator 130C may include a third mismatched differential circuit that has a third offset voltage $V_{os3}$ to enable the third threshold level voltage $V_{R3}$.

According to one embodiment of the present invention, each of the comparators 130A, 130B, and 130C includes a circuit corresponding to the mismatched differential circuit 10 described above in connection with FIGS. 1 through 4. Here, each of the mismatched differential circuits 10 included with the respective comparator 130A, 130B, or 130C has a different offset voltage $V_{os}$ from the other ones in order to provide the three different threshold levels.

For example, the first comparator 130A may include a width mismatched differential circuit to provide the first threshold level voltage $V_{R1}$, the second comparator 130B may include a bulk mismatched differential circuit to provide the second threshold level voltage $V_{R2}$, and the third comparator may include a width and bulk mismatched differential circuit to provide the third threshold level voltage $V_{R3}$.

According to another embodiment of the present invention, each of the mismatched differential circuits is implemented with a circuit corresponding to the mismatched differential circuit 10' described above in connection with FIG. 5. Here, each of the mismatched differential circuits 10' included with the respective comparator 130A, 130B, or 130C has a different offset voltage $V_{os}$ from the other ones in order to provide the three different threshold levels.

In this embodiment, at least one of the mismatched differential circuits 10' may be configured as a triple-mismatched differential pair. That is, at least one of the mismatched differential circuits may have three different mismatched parameters; for example, bulk-potential, device width, and bias current. This enables a wide range of offset voltages $V_{os}$, and thus, enables a wide range of threshold levels for the comparators.

Figure 7:
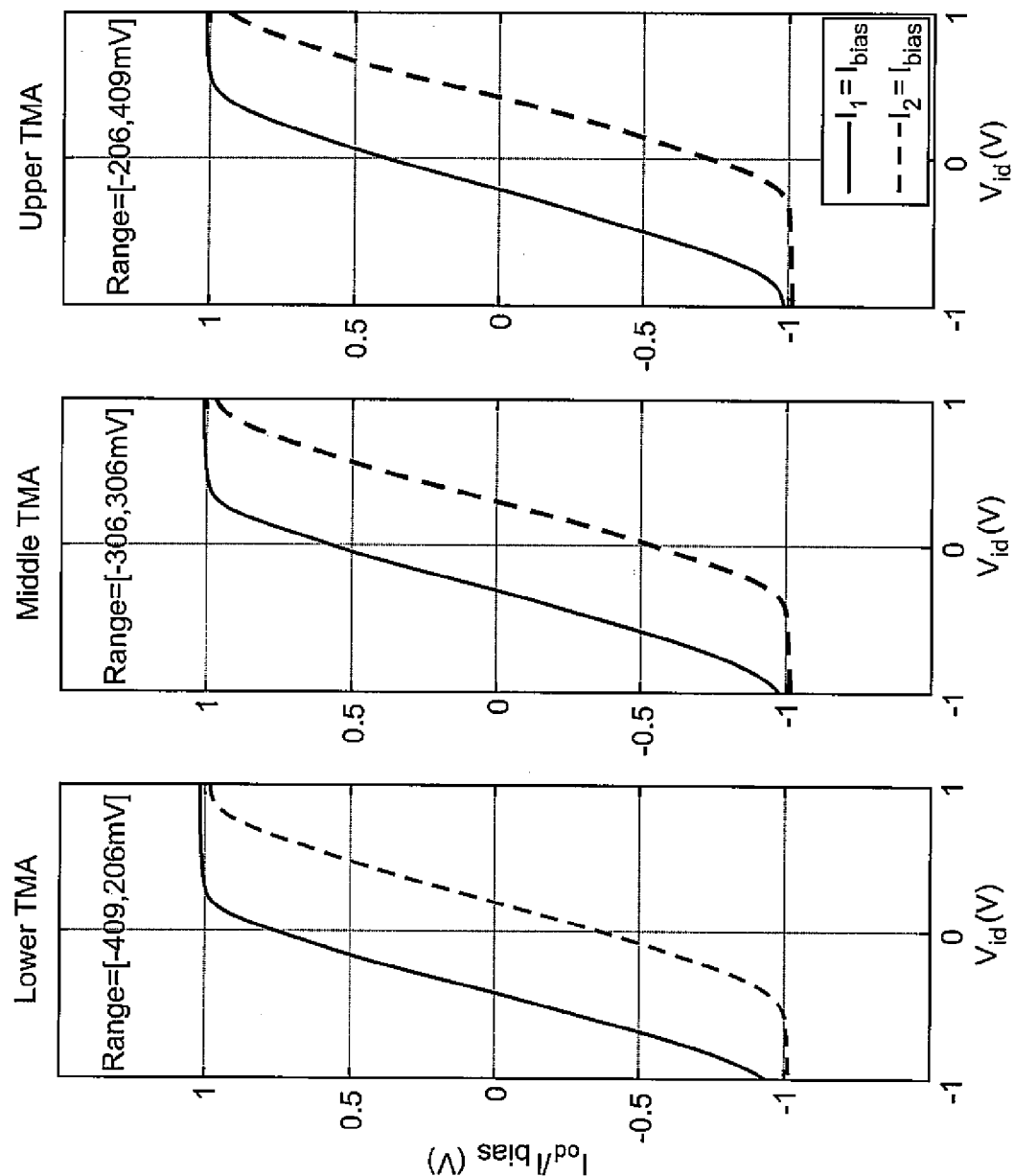
FIG. 7 depicts graphs illustrating the I-V characteristics of three differential circuits according to embodiments of the present invention.

Examples of achievable offset voltage ranges are illustrated in FIG. 7. FIG. 7 shows graphs illustrating the I-V characteristics of differential circuits according to embodiments of the present invention.

FIG. 7 illustrates I-V characteristic ranges for three differential circuits. These three I-V characteristic graphs may correspond to the three differential circuits for comparators 130A, 130B, and 130C described above in connection with FIG. 6. As illustrated in these graphs, the three mismatched differential circuits are configurable to provide a lower, middle, and upper set of offset voltage ranges to correspond to the lower, middle, and upper threshold levels of comparators used in a multilevel receiver.

According to one embodiment, the lower and upper mismatched differential circuits are triple-mismatched differential circuits, which are configurable to have bulk potential, device width, and bias current mismatches. The lower and upper mismatched differential circuits may be mirrors of each other. That is, amplifier legs in the lower mismatched differential circuit may have a particular mismatch of circuit properties and the amplifier legs in the upper mismatched differential circuit may have a corresponding, but reversed, mismatch of circuit properties (e.g., reversed as to which leg has which circuit properties).

For example, referring back to FIG. 5, the lower mismatched differential circuit may be configured such that the first and fourth transistors $T_1$ and $T_4$ have a bulk-to-source connection, the second and third $T_2$ and $T_3$ transistors have a bulk-to-ground connection, and the first and third transistors' widths $W_1$ and $W_3$ are the same size and greater than the second and fourth transistors' widths $W_2$ and $W_4$ (which are the same size). This configuration results in a first offset voltage $V_{os1}$. For example, in an embodiment where the first and third widths $W_1$ and $W_3$ are about 4.8 µm and the second and fourth widths $W_2$ and $W_4$ are about 1.2 µm, the first offset voltage $V_{os1}$ may be about −203 mV.

By configuring the upper mismatched differential circuit in a corresponding, but opposite fashion to the lower mismatched differential circuit, it may have a third offset voltage $V_{os3}$ that is the same magnitude but opposite in polarity as the first offset voltage $V_{os1}$. For example, the upper mismatched differential circuit may be configured such that the first and fourth transistors $T_1$ and $T_4$ have a bulk-to-ground connection, the second and third $T_2$ and $T_3$ transistors have a bulk-to-source connection, and the first and third transistors' widths $W_1$ and $W_3$ are the same size and less than the second and fourth transistors' widths $W_2$ and $W_4$ (which are the same size). In an embodiment where the first and third widths $W_1$ and $W_3$ are about 1.2 µm and the second and fourth widths $W_2$ and $W_4$ are about 4.8 µm, the third offset voltage $V_{os3}$ may be about +203 mV.

Accordingly, with this mirrored mismatch configuration, the lower and upper mismatched differential circuits may have offset voltages of the same magnitude, but with different polarity.

Also, according to one embodiment, the middle differential circuit may be configured such that its device properties are matched (i.e., that it is balanced) so that its offset voltage $V_{os2}$ is at 0V.

Furthermore, as described above, these differential circuits are configurable to have a triple-mismatch by adjusting a bias current. For example, referring back to FIG. 5, the current sinks $I_1$ and $I_2$ (collectively, setting the bias current) may be mismatched to further extend the offset voltage range. This may be implemented dynamically or statically. The I-V graphs of FIG. 7 illustrate an embodiment of this scenario.

In FIG. 7, the x-axis represents a differential input voltage and the y-axis represents a differential output current for the differential circuits. In each of the graphs, the solid line represents a configuration where the bias current is wholly supplied by the first current sink $I_1$ and the dashed line represents a configuration where the bias current is wholly supplied by the second current sink $I_2$. The area between these two lines are within the operable range of the mismatched differential circuits, and are achieved by adjusting the mismatch of the first and second current sinks $I_1$ and $I_2$. According to one embodiment the bias current is variable according the following expression: bias current=$I_1$+$I_2$.

In one embodiment, the offset voltage ranges are centered on the offset voltage for the configuration where the bias current is balanced between the first and second current sinks $I_1$ and $I_2$. As such, the center of the offset voltage ranges correspond the above-description of the first and third offset voltages $V_{os1}$ and $V_{os3}$ respectively corresponding to the mirrored lower and upper mismatched differential circuits and the second offset voltage $V_{os2}$ corresponding to the balanced middle differential circuit.

According to one embodiment, the bias current is about 400 µA. Therefore, the value of the currents of the first and second current sinks $I_1$ and $I_2$ add up to 400 µA. Here, the magnitude of the offset voltage range may be about 600 mV.

Accordingly, an embodiment of the lower mismatched differential circuit may have an offset voltage centered at about −203 mV and arrange of about −409 mV to about 206 mV, an embodiment of the middle mismatched differential circuit may have an offset voltage centered at about 0V and a range of about −306 mV to about 306 mV, and an embodiment of the upper mismatched differential circuit may have an offset voltage centered at about 203 mV and a range of about −206 mV to about 409 mV.

As such, when configuring comparators having mismatched differential circuits according to embodiments of the present invention for use in a multilevel signal receiver, a wide range of threshold levels are available.

Figure 8:
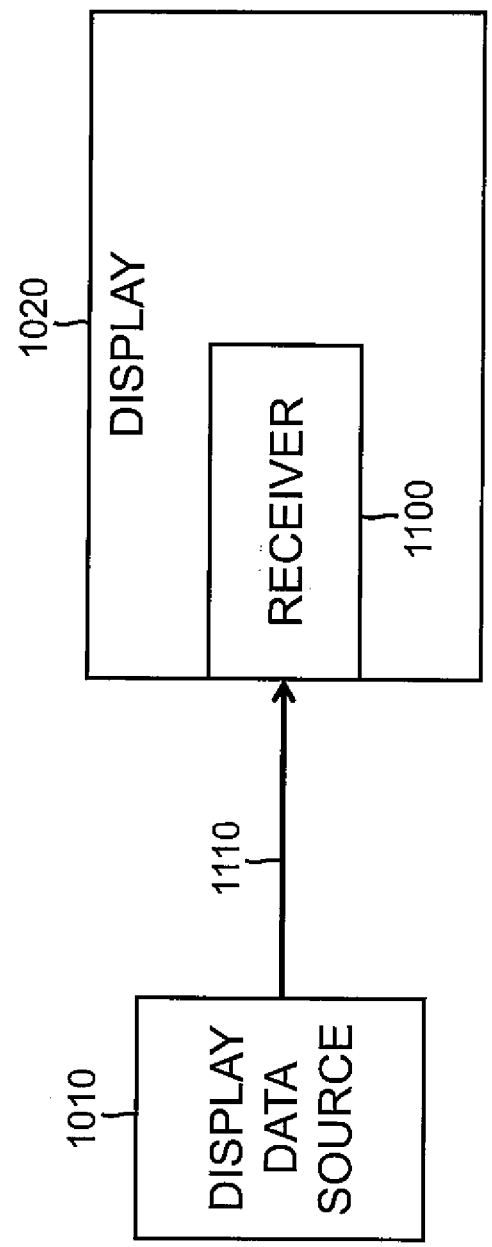
FIG. 8 is a block diagram of a digital communication link for a display according to an embodiment of the present invention.

FIG. 8 illustrates an exemplary application of a receiver in a digital communication link for a display according to an embodiment of the present invention. In the present embodiment, a display data source 1010 transmits a display data signal over a transmission link 1110 to a display 1020. The display data signal may include information for displaying an image on the display. The display may be, for example, an organic light emitting diode display, a liquid crystal display, or a plasma display.

The display 1020 includes a receiver 1100. The receiver 1100 may be implemented with the receiver circuit 100 described above in connection with FIGS. 6 and 7. That is, the receiver 1100 may be implemented using comparators having mismatched differential circuits according to embodiments of the present invention to receive the display data signal transmitted as a multilevel signal.

While aspects of the present invention have been illustrated and described in connection with certain exemplary embodiments, it is to be understood that the invention is not limited to the described embodiments, but, on the contrary, is intended to cover various modifications and equivalent arrangements included within the spirit and scope of the appended claims.

For example, while some exemplary embodiments of the present invention were described in connection with a PAM-4 multilevel data system, embodiments of the present invention are not limited thereto. That is, the aspects and features of the present invention may be variously applied, such as in other pulse amplitude modulation systems (e.g., PAM-5, -6, -7, etc.), in digital-to-analog converters, peak-detectors, or any other application that mismatched differential circuits may be used.

What is claimed is:

1. A differential amplifier comprising:
 a first amplifier leg comprising a first transistor; and
 a second amplifier leg comprising a second transistor,
 wherein a bulk of the first transistor is electrically coupled to an electrode of the first transistor such that a current can flow between the bulk and the electrode of the first transistor, and a bulk of the second transistor is coupled to a voltage source, such that the first transistor is configured to have a bulk potential different from a bulk potential of the second transistor,
 wherein the differential amplifier is configured to be at an input stage of a comparator,
 wherein the first amplifier leg and the second amplifier leg, together, are configured to differentially amplify a received differential input signal,
 wherein the differential amplifier is configured to have an input offset voltage, and
 wherein the input offset voltage corresponds to the difference between the bulk potential of the first transistor and the bulk potential of the second transistor, the differential amplifier further comprising:
 a first current sink configured to sink a first current;
 a second current sink configured to sink a second current;
 a third transistor; and
 a fourth transistor,
 wherein each of the first transistor, the second transistor, the third transistor, and the fourth transistor comprises a first terminal, a second terminal, and a gate,
 wherein the first terminal of the first transistor is coupled to the first terminal of the fourth transistor,
 wherein the first terminal of the second transistor is coupled to the first terminal of the third transistor,
 wherein the gate of the first transistor is coupled to the gate of the fourth transistor,
 wherein the gate of the second transistor is coupled to the gate of the third transistor,
 wherein the second terminal of the first transistor and the second terminal of the second transistor are coupled together and coupled to the first current sink,
 wherein the second terminal of the third transistor and the second terminal of the fourth transistor are coupled together and coupled to the second current sink, and wherein the input offset voltage further corresponds to the difference between the first current and the second current.

2. The differential amplifier of claim 1,
wherein the first transistor has a first device size and the second transistor has a second device size different from the first device size, and
wherein the input offset voltage further corresponds to the difference between the first device size and the second device size.

3. The differential amplifier of claim 2, wherein the first device size corresponds to a channel width or length of the first transistor and the second device size corresponds to a channel width or length of the second transistor.

4. The differential amplifier of claim 1, wherein the offset voltage is dynamically configurable by adjusting at least one of the first current, the second current, the bulk potential of the first transistor, the bulk potential of the second transistor, an effective width or length of the first transistor, or an effective width or length of the second transistor.

5. The differential amplifier of claim 1,
wherein the first transistor and the third transistor have a first device size,
wherein each of the second transistor and the fourth transistor has a second device size different from the first device size, and
wherein the input offset voltage further corresponds to the difference between the first device size and the second device size.

6. The differential amplifier of claim 1,
wherein each of the first transistor and the second transistor is a field effect transistor and comprises a bulk, a gate, a drain, and a source,
wherein the bulk of the first transistor is coupled to one of the source of the first transistor, a ground, or a bias voltage source,
wherein the bulk of the second transistor is coupled to one of the source of the second transistor, the ground, or the bias voltage source, and
wherein the bulk of the first transistor is coupled differently than the bulk of the second transistor to cause the bulk potential of the first transistor to be different from the bulk potential of the second transistor.

7. The differential amplifier of claim 6,
wherein each of the first transistor and the second transistor is a P-MOS field effect transistor,
wherein the bulk of the first transistor is coupled to the source of the first transistor, and
wherein the bulk of the second transistor is coupled to the bias voltage source.

8. The differential amplifier of claim 6,
wherein each of the first transistor and the second transistor is a N-MOS field effect transistor,
wherein the bulk of the first transistor is coupled to the source of the first transistor, and
wherein the bulk of the second transistor is coupled to the ground.

9. The differential amplifier of claim 6,
wherein the bulk of the first transistor is coupled to the bias voltage source,
wherein the bulk of the second transistor is coupled to the ground, and
wherein the bias voltage source is controllable to dynamically change the difference between the bulk potential of the first transistor and the bulk potential of the second transistor.

10. A multilevel signal receiver, comprising:
an input terminal for receiving a multilevel differential signal;
a data slicer coupled to the input terminal and configured to determine voltage levels of the multilevel differential signal, the data slicer comprising a plurality of comparators; and
a decoder coupled to an output of the data slicer and configured to decode bits of the multilevel differential signal,
wherein each of the comparators comprises a differential amplifier, the differential amplifier comprising:
a first amplifier leg comprising a first transistor, and
a second amplifier leg comprising a second transistor, the second transistor being configured to have a bulk potential different from a bulk potential of the first transistor,
wherein the first amplifier leg and the second amplifier leg, together, are configured to differentially amplify the multilevel differential signal to generate a threshold determination signal,
wherein the differential amplifier is configured to have an input offset voltage, and
wherein the input offset voltage corresponds to the difference between the bulk potential of the first transistor and the bulk potential of the second transistor,
wherein each of the comparators is configured to have a threshold level different from the threshold level of other ones of the comparators,
wherein each of the comparators is configured to output its threshold determination signal to the decoder to indicate whether or not the multilevel signal is greater than its threshold level, and
wherein, for each of the comparators, the threshold level corresponds to the input offset voltage of the differential amplifier.

11. The multilevel signal receiver of claim 10,
wherein the plurality of comparators comprises a first comparator having its threshold level set to a first level, a second comparator having its threshold level set to a second level, and a third comparator having its threshold level set to a third level,
wherein the multilevel signal is configured to encode two bits using four signal levels, and
wherein the first level, the second level, and the third level are respectively set to detect the four signal levels.

12. The multilevel signal receiver of claim 10, wherein in the differential amplifier of at least one of the comparators:
the first transistor has a first device size and the second transistor has a second device size different from the first device size, and
the input offset voltage further corresponds to the difference between the first device size and the second device size.

13. The multilevel signal receiver of claim 10,
wherein the differential amplifier of each of the comparators further comprises:
a first current sink configured to sink a first current;
a second current sink configured to sink a second current;
a third transistor; and
a fourth transistor, and wherein in the differential amplifier of at least one of the comparators:
- each of the first transistor, the second transistor, the third transistor, and the fourth transistor comprises a first terminal, a second terminal, and a gate,
- the first terminal of the first transistor is coupled to the first terminal of the fourth transistor,
- the first terminal of the second transistor is coupled to the first terminal of the third transistor,
- the gate of the first transistor is coupled to the gate of the fourth transistor,
- the gate of the second transistor is coupled to the gate of the third transistor,
- the second terminal of the first transistor and the second terminal of the second transistor are coupled together and coupled to the first current sink,
- the second terminal of the third transistor and the second terminal of the fourth transistor are coupled together and coupled to the second current sink, and
- the input offset voltage further corresponds to the difference between the first current and the second current.

14. The multilevel signal receiver of claim 13, wherein in the differential amplifier of at least one of the comparators the offset voltage is dynamically configurable by adjusting at least one of the first current, the second current, the bulk potential of the first transistor, the bulk potential of the second transistor, an effective width or length of the first transistor, or an effective width or length of the second transistor.

15. The multilevel signal receiver of claim 13, wherein in the differential amplifier of at least one of the comparators:
- each of the first transistor and the third transistor has a first device size,
- each of the second transistor and the fourth transistor has a second device size different from the first device size, and
- the input offset voltage further corresponds to the difference between the first device size and the second device size.

16. The multilevel signal receiver of claim 10, wherein in the differential amplifier of at least one of the comparators:
- each of the first transistor and the second transistor is a field effect transistor and comprises a bulk, a gate, a drain, and a source,
- the bulk of the first transistor is coupled to one of the source of the first transistor, a ground, or a bias voltage source,
- the bulk of the second transistor is coupled to one of the source of the second transistor, the ground, or the bias voltage source, and
- the bulk of the first transistor is coupled differently than the bulk of the second transistor to cause the bulk potential of the first transistor to be different than the bulk potential of the second transistor.

17. The multilevel signal receiver of claim 16, wherein in the differential amplifier of at least one of the comparators:
- each of the first transistor and the second transistor is a P-MOS field effect transistor,
- the bulk of the first transistor is coupled to the source of the first transistor, and
- the bulk of the second transistor is coupled to the bias voltage source.

18. The multilevel signal receiver of claim 16, wherein in the differential amplifier of at least one of the comparators:
- each of the first transistor and the second transistor is a N-MOS field effect transistor,
- the bulk of the first transistor is coupled to the source of the first transistor, and the bulk of the second transistor is coupled to the ground.

* * * * *